United States Patent [19]
Kim et al.

[11] Patent Number: 5,386,336
[45] Date of Patent: Jan. 31, 1995

[54] ON CHIP CURRENT LIMITER

[75] Inventors: Jason S.-M. Kim, Los Angeles; James M. Anderson, Huntington Beach, both of Calif.

[73] Assignee: TRW Inc., Redondo Beach, Calif.

[21] Appl. No.: 901,469

[22] Filed: Jun. 19, 1992

[51] Int. Cl.⁶ .......................................... H03K 17/12
[52] U.S. Cl. ........................................ 361/93; 361/100
[58] Field of Search ................. 361/91, 88, 58, 93, 361/100; 307/443; 323/315

[56] References Cited

U.S. PATENT DOCUMENTS

| | | | |
|---|---|---|---|
| 4,275,313 | 6/1981 | Boll et al. | 307/448 |
| 4,347,447 | 8/1982 | Proebsting | 307/442 |
| 4,398,160 | 8/1983 | Neidorff | 330/288 |
| 4,543,494 | 9/1985 | Wakimoto | 307/443 |
| 4,608,530 | 8/1986 | Bacrania | 323/315 |
| 4,612,457 | 9/1986 | Prater | 307/443 |
| 4,612,497 | 9/1986 | Ulmer | 361/58 |
| 4,701,643 | 10/1987 | Laude et al. | 307/450 |
| 4,709,171 | 11/1987 | Main | 307/567 |
| 4,771,189 | 9/1988 | Noufer | 307/443 |
| 4,782,252 | 11/1988 | Levy et al. | 307/443 |
| 4,810,902 | 3/1989 | Storti et al. | 307/446 |
| 4,849,847 | 7/1989 | McIver et al. | 361/88 |
| 5,140,177 | 8/1992 | Suda et al. | 307/443 |

Primary Examiner—A. D. Pellinen
Assistant Examiner—S. Jackson

[57] ABSTRACT

A current limiting circuit and technique is provided for preventing excessive current supplied to a circuit and for providing self-recovery characteristics thereto. The current limiting circuit includes an input for receiving a supply voltage for supplying power to the monitored circuit and an output for providing the power to the desired circuit being monitored. The circuit employs a drive transistor having a source connected to the input and a drain connected to the output. The drive transistor further includes a gate for receiving a control signal. A current mirror circuit is provided for sensing a current overload and adjusting the control signal to indicate the amount of current drawn. During normal current draw, the circuit provides the supply voltage as the output. When excessive current draw is detected, the drive transistor is turned off and the output current is thereby cut off. When the current decreases to normal current loads, the drive transistor is turned back on. In addition, a reset signal may be further generated when excessive current is detected to reset the internal logic on a chip, so as to correct the problem causing the excessive current draw. Furthermore, the monitored circuit and herein described current limiting circuit may be fabricated together on the same die or chip.

16 Claims, 2 Drawing Sheets

ON CHIP CURRENT LIMITER

This invention was made with Government support under contract No. 7176-49. The Government has certain rights in this invention.

BACKGROUND OF THE INVENTION

1. Technical Field

This invention relates generally to current limiting devices and, more particularly, to current limiters for preventing excessive current supply and providing self-recovery characteristics.

2. Discussion

Due to the relatively high current drive capabilities of a chip, an excessive amount of current may be drawn by the chip's active circuitry upon power up or an illegal operation of the chip. As a consequence, this excessive amount of current may result in damage to the chip. As a means of protection, it is therefore generally desirable to employ a current limiter for limiting the amount of current supplied to the active circuitry of an integrated circuit or chip.

Protective current limiting devices have been developed for preventing excessive current supply to the active circuitry of a chip. Conventional current limiting techniques have included the use of an external circuit breaker made up of discrete components. Other techniques have included the use of a current limiting transistor with a selectively coupled resistor. These techniques generally monitor the current supplied to the chip and prevent excessive current flow thereto by either disconnecting the power supply or limiting the power to a maximum preset level.

Conventional current limiting techniques such as those which employ an external circuit breaker, generally limit the amount of current supplied to a chip by shutting off the chip's power supply upon detecting excessive current. However, such techniques, by themselves, leave the chip inoperative. In addition, such techniques generally do not correct the problem that caused the excessive current demand. In order to allow for proper operation of the chip, it is generally required that the problem which caused the excessive current be corrected and the circuit be reset.

Conventional techniques have typically required external components and the need for an operator in order to re-energize the chip. In addition, an operator and external components are further required to correct the problem causing the excessive amount of current. For applications such as those involving unmanned vehicles and the like, it is desirable to have a current limiter with self-recovery characteristics for automatically putting a chip back into operation and which does not require an operator or excessive external components.

It is therefore desirable to obtain a current limiter which prevents excessive current supply and provides for self-recovery characteristics. It is further desirable to obtain such a current limiter which does not require excessive external components. In particular, it is desirable to provide for such a current limiter which may operate to prevent excessive current supply to the active circuitry of a chip and to allow self-recovery thereof.

SUMMARY OF THE INVENTION

In accordance with the teachings of the present invention, a current limiting circuit and technique are provided having self recovery characteristics. The circuit includes a drive transistor having a source for receiving a supply voltage and a drain for providing an output signal. The drive transistor further includes a gate for receiving a control signal which controls the transmission of the supply voltage from the input to the output. During normal current loads the drive transistor allows the supply voltage to be provided as the output to operate active circuitry such as that on a chip. When the current supply exceeds a preset value the current limiter shuts off the current supply provided by a drive transistor. When the current demand falls back below a preset value, the supply current is reapplied through its drive transistors. In addition, a reset signal may be generated when an excessive current is detected which resets a chip's internal logic so as to correct the cause of the excessive current. The current limiter then allows the voltage supply to be provided to the output under normal current loads.

BRIEF DESCRIPTION OF THE DRAWINGS

Other objects and advantages of the present invention will become apparent to those skilled in the art upon reading the following detailed description and upon reference to the drawings in which.

DETAILED DESCRIPTION OF THE PREFERRED EMBODIMENT

Figure 1:
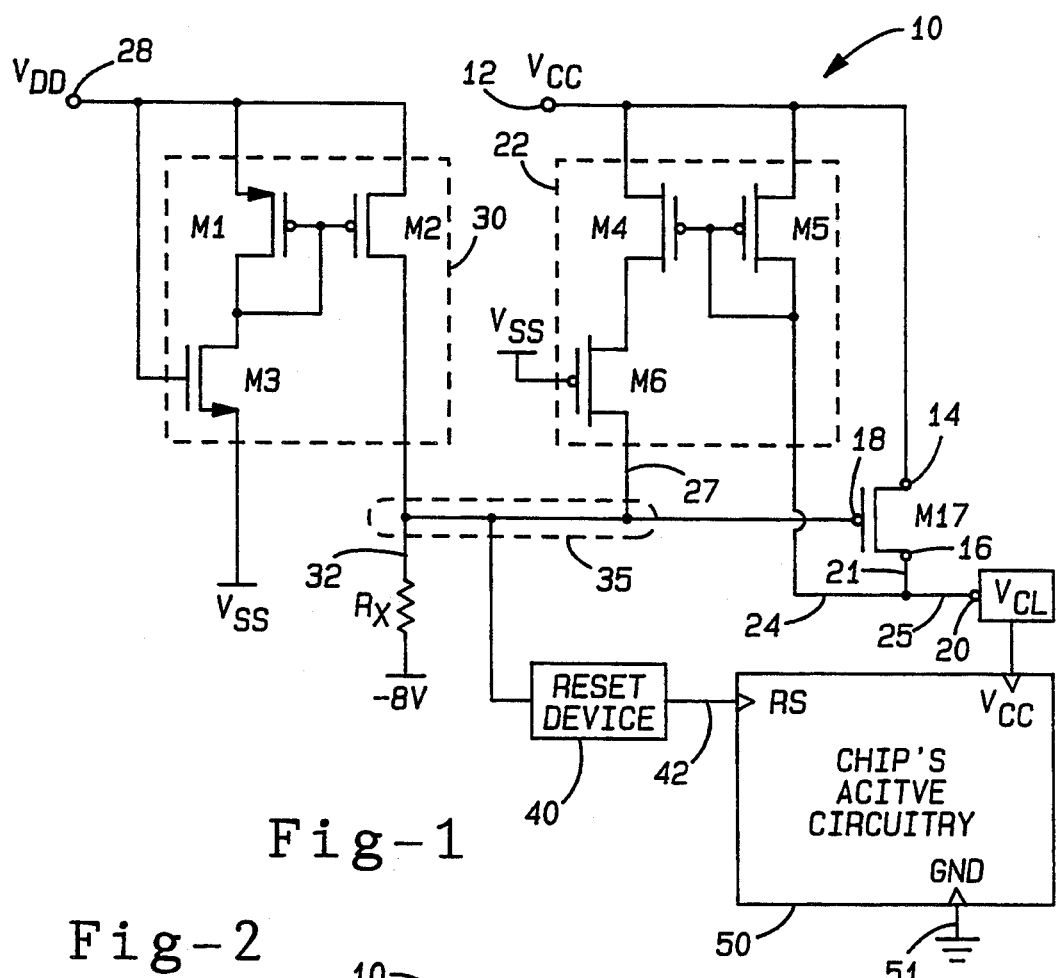
FIG. 1 is a circuit diagram which illustrates a current limiting circuit in accordance with the present invention.

Turning now to FIG. 1, a current limiting circuit 10 is illustrated therein in accordance with the preferred embodiment of the present invention. The current limiting circuit 10 is described herein in connection with a current limiting technique for limiting the current supplied to the active circuitry of an integrated circuit or chip 50. However, the current limiting circuit 10 and technique may be used to limit the current supplied to various types of active circuitry.

The current limiting circuit 10 includes an input terminal 12 for receiving a power supply voltage $V_{cc}$. The power supply voltage $V_{cc}$ normally provides the power required to operate the active circuitry on a chip or other device. The current limiting circuit 10 further includes an output terminal 20 for supplying a current limited output signal $V_cL$ to the active circuitry on a chip 50. The current limited output signal $V_cL$ has an output current 25 which is provided to the protected circuitry. A drive transistor M17 is employed having a source terminal 14 connected to the input terminal 12 and a drain terminal 16 connected to the output terminal 20. The drive transistor M17 further includes a gate terminal 18. The gate terminal 18 receives a control signal which operates to control the transmission of the power supply voltage $V_{cc}$ from the source terminal 14 to the drain terminal 16 of drive transistor M17. As a result, a first current 21 flows through the drive transistor M17 and is provided to the output terminal 20.

The current limiting circuit 10 includes a first current mirror circuit 22 made up of three transistors M4, M5 and M6. Transistor M5 is connected in parallel with the drive transistor M17 such that the source of transistor M5 is connected to the input terminal 12 and the drain is connected to the output terminal 20. Transistors M4 and M6 are connected in series such that the drain of transistor M4 is connected to the source of transistor M6. The source of transistor M4 is connected to the input terminal 12 and the drain of transistor M6 is connected to the gate terminal 18 of the drive transistor M17. Transistor M6 has a control gate connected to a low voltage source $V_{ss}$. The low voltage source $V_{ss}$ generally provides a low voltage or is grounded such that transistor M6 remains "on" at all times. Transistor M4 has a gate control connected to the gate control on transistor M5. In addition, the drain of transistor M5 is further connected to the gates of transistors M4 and M5.

Transistor M5 of the first current mirror 22 operates to provide a small second current 24 therethrough and in particular when the output current 25 is excessive. The second current 24 is thereby amplified and mirrored to transistors M4 and M6 which results in a mirror current 27. Transistor M5 is preferably on the order of at least fifty to one hundred times smaller than the drive transistor M17 as appropriate to the intended application and, as such, provides for a much smaller sensing current. For most practical applications transistor M5 will likely be several hundred to several thousand times smaller than drive transistor M17.

The current limiting circuit 10 further includes a second input terminal 28 for receiving a second supply voltage $V_{dd}$. The second supply voltage $V_{dd}$ supplies power to the internal logic of the chip 50. A second current mirror circuit 30 is provided which is connected between the input terminal 28 and the gate terminal 18 of the drive transistor M17. The second current mirror circuit 30 includes transistors M1, M2 and M3. Transistor M2 has a source connected to the second input terminal 28 and a drain connected to the gate terminal 18 of the drive transistor M17. Transistors M1 and M3 are connected in series such that the drain of transistor M1 is connected to the source of transistor M3. The source of transistor M1 is connected to the second input terminal 28 and the drain of transistor M3 is connected to the low voltage source $V_{ss}$ which may be grounded. Transistor M3 further has a gate connected to the second input terminal 28. The gate control on transistor M1 and transistor M2 are connected together. In addition, the drain of transistor M1 is further coupled to the gates of transistors M1 and M2.

An external resistor $R_x$ is included having a first end connected to the second current mirror circuit 30 via the drain of transistor M2. The other end of the external resistor $R_x$ is connected to ground or a more negative source depending on available external resistor $R_x$. The first end of external resistor $R_x$ is coupled to the drain of transistors M2 and M6, the gate terminal of drive transistor M17, and a reset device 40, as illustrated by node 35. The control voltage 28 is applied to transistor M2 and is further applied to the external resistor $R_x$ as a bias current 32. In addition, the drain of transistor M6 may provide an additional mirror current 27 during excessive output current 25 demand. The bias current 32 thereby generates a voltage potential at a node 35 which is applied to the input of the gate terminal 18 of the drive transistor M17. External resistor $R_x$ is preferably a precision resistor with a relatively low temperature coefficient. However, external resistor $R_x$ may include other kinds of resistors such as a thermo-resistor for detecting temperature and thereby allowing for a reset and/or "temperature too high" signal to be generated.

The current limiting circuit 10 further includes a reset circuit or device 40 which is connected to the node 35 for receiving the voltage potential thereon. As such, the reset device 40 monitors the voltage thereon and, upon reaching a preset level indicative of a current overload, generates a reset signal 42.

Figure 2:
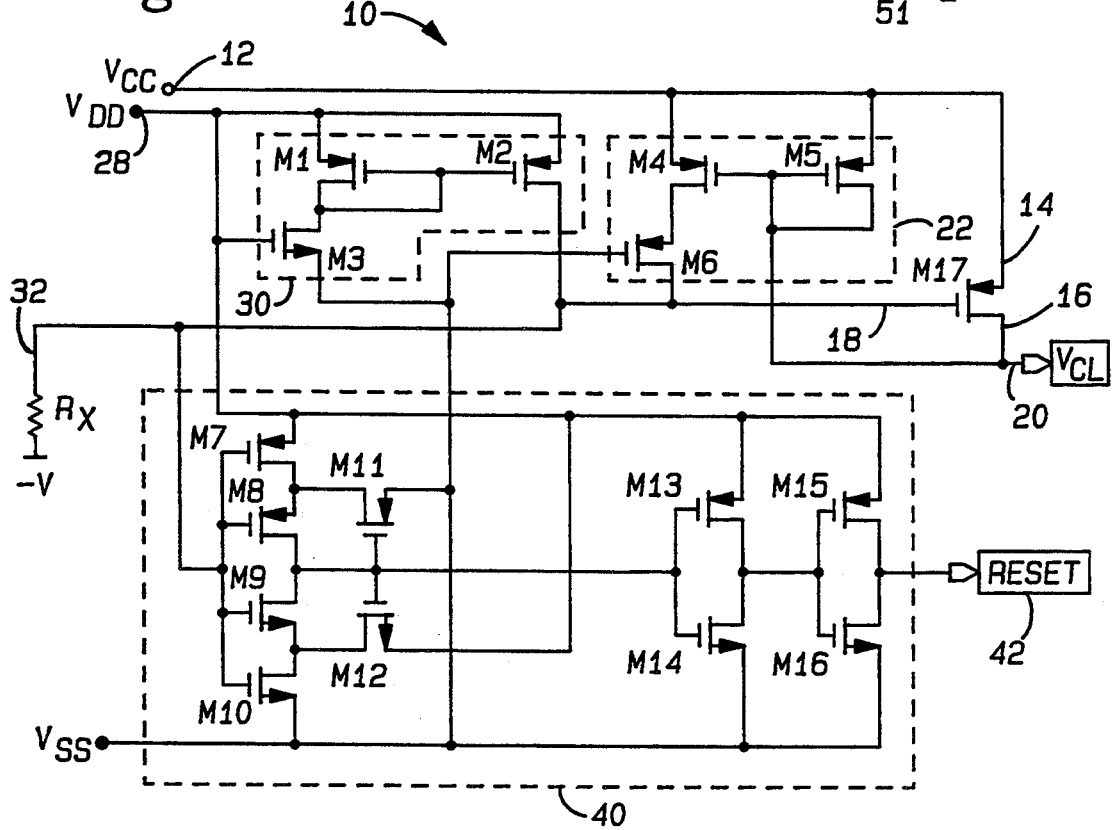
FIG. 2 is a circuit diagram which further illustrates the current limiting circuit shown in FIG. 1.

One example of a reset circuit 40 is shown in FIG. 2 in conjunction with the present invention. The reset circuit 40 shown therein provides for hysteresis which thereby has the characteristics of a time delay. However, other types of reset circuits may be employed which are compatible therewith. Such reset circuits may include those employing a Schmidt-trigger which provide for an attenuation.

The reset circuit 40 shown in FIG. 2 includes four transistors M7, M8, M9 and M10 connected in series such that transistor M7 has a source connected to the second supply voltage $V_{dd}$ and a drain connected to the source of transistor M8. The drain of transistor M8 is connected to the drain of transistor M9. The source of transistor M9 is connected to the drain of transistor M10, which has a source provided to the low voltage source $V_{ss}$. Each of the transistors M7 through M10 has a gate control connected to node 35 for receiving the voltage potential thereon.

The reset circuit 40 further includes a transistor M11 having a drain coupled to the drain of transistor M7 and further has a source connected to the low voltage source $V_{ss}$. A transistor M12 is included having a drain connected to the drain of transistor M10 and further having a source connected to the second supply voltage $V_{dd}$. Transistors M13 and M14 are included and are connected in series such that the drain of transistor M13 is connected to the drain of transistor M14. Transistor M13 has a source connected to second supply voltage $V_{dd}$ and transistor M14 which has a source connected to low voltage source $V_{ss}$. Each of transistors M11, M12, M13 and M14 has a gate connected to the common drains of transistors M8 and M9.

The reset circuit 40 further includes a transistor M15 having a source connected to the second supply voltage $V_{dd}$. The transistor M15 has a drain connected to the drain of a transistor M16 which has a source connected to low voltage source $V_{ss}$. Transistors M15 and M16 each have a gate connected to the drains of transistors M13 and M14. As a result, the reset circuit 40 receives the voltage potential at node 35 and provides a reset signal 42 when the voltage potential exceeds a preset value. The preset value is indicative of an excessive current draw. The reset signal 42 is employed by the current limiting circuit 10 to reset the chip's control logic to thereby correct the problem causing the excessive current draw. This is generally where the output current 25 is routed exclusively to high power PMOS drive transistors which are usually provided for driving signals off of the chip 50.

The drive transistor M17 and transistors M1 through M16 have been described herein as three terminal devices each having a source, a drain and a gate. Transistors M1 through M17 are not limited to any particular type of transistor, as any standard three terminal MOS, bipolar and like transistors may be employed, so long as appropriate transistor geometries are used as would be evident to those skilled in the art. However, the preferred embodiment provides PMOS devices for transistors M1–M2, M4–M8, M11, M13, M15 and M17, while transistors M3, M9–M10, M12, M14 and M16 are NMOS devices.

The absolute device sizings and exact relative size ratios of the components employed by the current limiting circuit 10 are dependent upon several factors. Such factors may include one's choice of technology, the current supply requirements of the protected circuitry such as those of any PMOS output drive transistors, the value chosen for external resistor $R_x$, the input requirements of any reset device 40, amongst other possible factors. In addition, there are preferred relationships between certain components. As such, drive transistor M17 would most practically be a great deal larger than transistor M5 by a factor ranging from several hundred to several thousand. The transistors M1 through M3 and M4 through M6 may be of minimum size or nearly so and adjusted in size as appropriate in order to achieve the desired operating characteristics with external resistor $R_x$. External resistor $R_x$ preferably has a high value in the order of 100 k Ohms which allows for external resistor compactness of current mirror 22 and 30 and also for conserving operating power. The means and methods of reducing the current limiting circuit 10 to practice in a particular application should become well known to those skilled in the art once they are given the descriptions set forth herein.

In operation, the current limiting circuit 10 receives a power supply voltage $V_{cc}$ from a supply source via input terminal 12. The power supply voltage $V_{cc}$ is the power that is normally supplied to the active output and relatively high current draw circuitry of a chip 50. When the chip 50 is operating under normal current loads, the power supply voltage $V_{cc}$ is transmitted through the drive transistor M17 and provided to the output terminal 20 as the current limited voltage $V_{cl}$ having an output current 25 for providing power to the active output and other relatively high current draw circuitry of the chip 50.

Current mirror 30 not only provides a quiescent operating current 32 through external resistor $R_x$, but also affords temperature compensation. The drain current 21 of drive transistor M17 has an inverse relationship to temperature. As some applications may find this undesirable, a compensating means is herewith revealed. Temperature compensation is achieved by virtue of the fact that transistor M2, occupying the same substrate as drive transistor M17, experiences the same temperature as does drive transistor M17 and therefore the current flowing through it is also reduced as temperature increases. This has the effect of allowing the voltage at node 35 to become increasingly negative as temperature increases which in turn increases the gate to source potential on drive transistor M17 thus reducing its channel resistance and thereby effectively compensating for the temperature effect.

During such normal current loads, a normal bias current 32 flows through the external resistor $R_x$ and thereby establishes an operating gate voltage at the gate terminal 18 of the drive transistor M17. With the drive transistor M17 transmitting the power supply voltage $V_{cc}$ therethrough to the output terminal 20, the second current 24 through transistor M5 is relatively small, if any.

When the active circuitry of the chip 50 draws an operating output current 25 in excess of the normal operating load, a current overload condition then exists. During a current overload, the second current 24 through transistor M5 increases so as to share the transmission of the operating current 25 with first current 21 transmitted through drive transistor M17. The increase in the second current 24 through transistor M5 is thereby mirrored to the mirror current 27 flowing through transistors M4 and M6. The increased conduction of mirror current 27 through transistors M4 and M6 provides for an increased bias current 32 through external resistor $R_x$ which provides for an increased voltage at node 35. The increased voltage at node 35 is applied to gate terminal 18 of drive transistor M17, which thereby reduces the gate to source voltage on drive transistor M17. The reduced gate to source voltage across the drive transistor M17 causes a decrease in current flow therethrough which results in increased second current 24 flowing through transistor M5. This creates the effect of a positive feedback which shuts off drive transistor M17 to thereby limit the operating output current 25 surge.

When the current demand decreases to normal current loads, the reduced output current 25 causes a reduced mirror current 27 through transistors M4 and M6. This in turn causes a reduced bias current 32 through external resistor $R_x$ which results in a lower voltage at node 35. This in turn increases the gate to source voltage on the drive transistor M17. As a result, drive transistor M17 initially turns on somewhat slowly so as to increase the first current 21 transmitted therethrough. This causes a decrease in the second current 24 through transistor M5 which essentially goes into a positive feedback to thereby turn drive transistor M17 on more strongly. As a result, the chip 50 has been completely reset by itself when a current surge is detected by transistor M5.

In addition, a reset circuit 40 may be employed to reset the internal logic of the chip 50 so as to correct any problems causing the excessive current draw. In doing so, the increased voltage across external resistor $R_x$ is detected by the reset circuit 40. When the voltage potential across the external resistor $R_x$ reaches a preset level, the reset circuit 40 generates a reset signal 42 to reset the chip's internal logic. The reset circuit 40 shown in FIG. 2 has hysteresis which allows the reset signal 42 to be applied to the chip's internal logic for a preset time period. By resetting the chip's internal logic, the problem causing the excessive current load should be corrected such that the chip may be enabled to operate properly. With the chip reset and the problem corrected the current load rapidly declines and the chip output are buffers and other relatively high current functions are re-energized.

The preferred embodiment of the current limiting circuit 10 as illustrated in FIGS. 1 and 2 is substantially a PMOS version of the circuit for purposes of limiting the current supplied to the active circuitry that is being protected. However, such a device could be employed for purposes of limiting the current drain exiting from the active circuitry in contrast to the current supplied thereto. As such, an alternate embodiment of the current limiting circuit 10 is shown in FIG. 3 as current limiting circuit 60.

Figure 3:
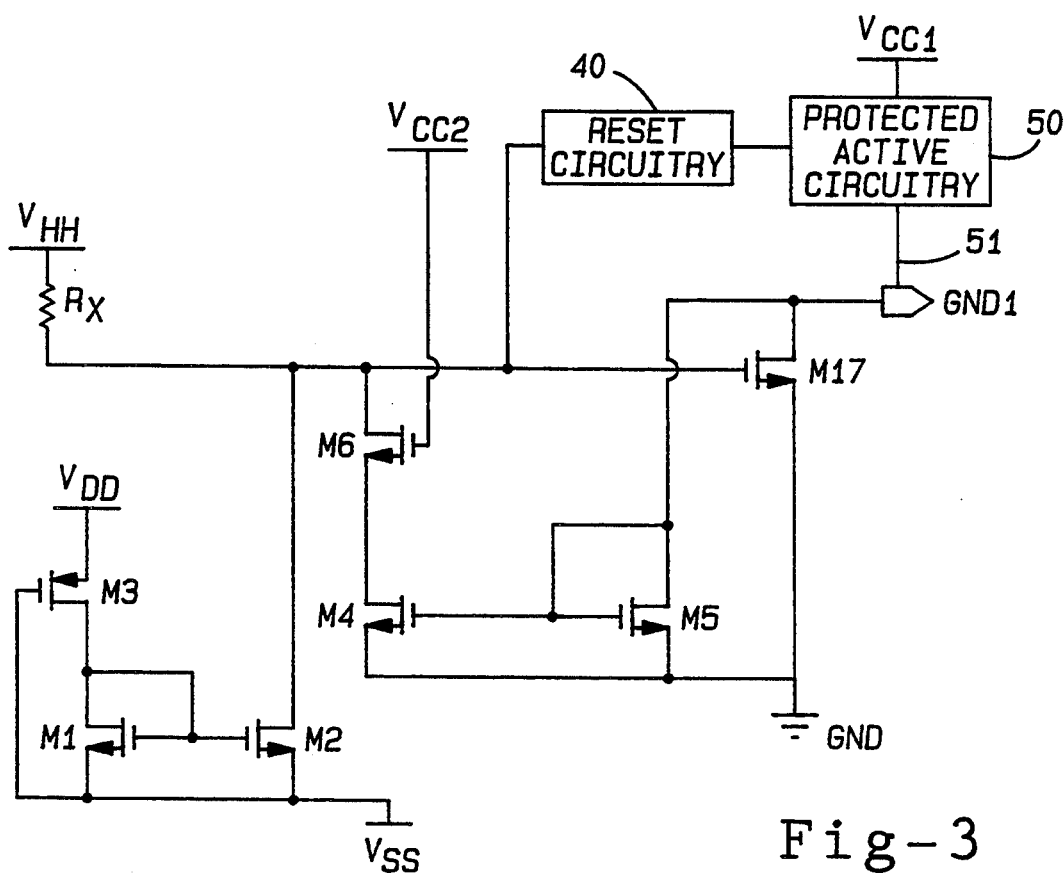
FIG. 3 is a circuit diagram which illustrates an alternate embodiment of the current limiting circuit.

The alternate embodiment of the current limiting circuit 60 as shown in FIG. 3 is essentially an NMOS version which may be attractive for P-well process implementation. The alternate embodiment of the current limiting circuit 60 is designed in substantially the same manner as the preferred embodiment with the exception that the current supplied to the protected active circuitry of the chip is limited by controlling the output current 51 that is transmitted to ground. The active circuitry generally may include open drain NMOS output drive transistors which are usually provided for purposes of driving signals off of the chip 50. In addition, transistors M1, M2, M4–M6 and M17 are NMOS transistors, while transistor M3 is preferably a PMOS transistor. As such, the current entering the chip 50 protected active circuitry is limited by the current drain allowed to exit therefrom.

Figure 4:
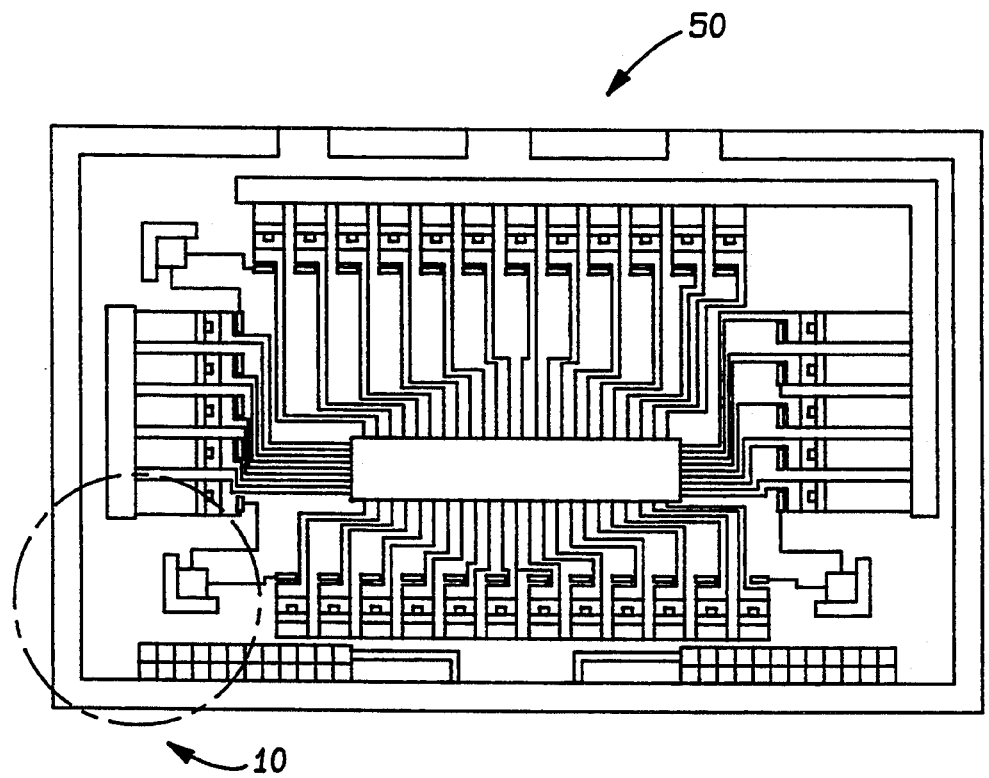
FIG. 4 is an integrated circuit layout plot of a chip employing a current limiting circuit.

FIG. 4 illustrates an example of a chip 50 which employs the current limiting circuit 10. Current limiting circuit 10 is shown mounted or fabricated on the chip 50. The current limiting circuit 10 may limit the current provided to all of the active circuitry of the chip 50 or limit a portion thereof, depending on the desired application.

The invention disclosed herein has been described in connection with a current limiting circuit 10 mounted or fabricated on a chip 50. However, the current limiting circuit 10 may be mounted separate from the chip 50. In addition, the current limiting circuit 10 is not limited in application to a chip 50, as other types of active circuitry or devices may employ the current limiting circuit 10 in a likewise fashion. Furthermore, as illustrated by the alternate embodiment shown in FIG. 3, other forms of the current limiting 10 may be provided without departing from the spirit of the invention.

In view of the foregoing, it can be appreciated that the present invention enables the user to achieve a current limiting circuit 10 having self-recovery characteristics. Thus, while this invention has been disclosed herein in connection with a particular example thereof, no limitation is intended thereby, except as defined by the following claims. This is because the skilled practitioner will recognize that other modifications can be made without departing from the spirit of this invention after studying the specification and drawings.

What is claimed is:

1. A current limiter comprising:
   input means for receiving an input signal;
   output means for providing a current limited output current;
   a drive transistor having a source terminal coupled to said input means for receiving said input signal, and a drain terminal coupled to said output means, said drive transistor further having a gate terminal for receiving a bias control signal, said drive transistor allowing the input signal to be applied as the output current during normal current loads and for further disconnecting said input signal from said output means when said output current exceeds a preset amount of current which is indicative of a current overload condition; and
   a current mirror circuit including a first transistor connected between said input means and output means and in parallel with said drive transistor for transmitting overflow current to the output means when excessive current flow is detected, said circuit further having a current mirror path connected to the gate terminal of said drive transistor for providing a mirror current when a current overload condition exists so as to increase the bias control signal applied to the gate of the drive transistor.

2. The current limiter as defined in claim 1 wherein said first current mirror means further comprises:
   a second transistor having a source coupled to said input means and a gate coupled to a gate of said first transistor; and
   a third transistor having a source coupled to a drain of the second transistor, and having a drain connected to the gate terminal of said drive transistor so that said second and third transistors provide said current mirror path.

3. The current limiter as defined in claim 1 further comprising:
   means for providing a reset signal when said output current exceeds a preset amount of current; and
   reset means for receiving said reset signal and for resetting chip internal logic to correct current demand such that when the output current has normal amounts of current, said drive transistor again allows the input signal to be transmitted as the output current.

4. The current limiter as defined in claim 1 further comprising a bias control resistor coupled to the gate of the drive transistor and a bias signal source for producing a reference voltage for said bias control signal.

5. The current limiter as defined in claim 4 further comprising a second current mirror circuit having at least one transistor connected between said bias voltage and said resistor and formed on a substrate common to said drive transistor so as to achieve temperature compensation.

6. The current limiter as defined in claim 1 wherein said bias control signal is provided from an internal logic supply signal applied to a bias control resistor to create a reference voltage potential thereacross.

7. The current limiter as defined in claim 6 further comprising:
   a second current mirror circuit coupled between said internal logic supply signal and said resistor for receiving the chip's internal logic supply current and providing said supply signal to the resistor.

8. A current limiting circuit for limiting the current provided to the active circuitry of a chip, said circuit comprising:
   input means for receiving an input signal;
   output means for providing a current limited output current to the active circuitry of a chip;
   a drive transistor having a source terminal coupled to said input means for receiving said input signal, and a drain terminal coupled to said output means, said drive transistor further having a gate terminal for receiving a bias control voltage, said drive transistor allowing the input signal to be applied as the output current during normal current loads, said drive transistor disconnecting said input signal from said output means when said bias control voltage exceeds a preset voltage level indicative of an output current overflow condition;
   a bias control resistor connected to the gate of said drive transistor for providing said bias control voltage in response to a bias control signal; and
   current mirror means having a current overflow path connected between said input means and output means and in parallel with said drive transistor for transmitting an overflow current to the output means when an output current overflow condition is detected, said current mirror means further having a current mirror path connected to the gate of said drive transistor for providing a mirror current when a current overload condition exists so as to increase said bias control voltage applied to the drive transistor.

9. The current limiting circuit as defined in claim 8 further comprising:

means for providing a reset signal when said output current exceeds a preset current level; and reset means for receiving said reset signal and for resetting chip internal logic to correct current demand such that when the output current draws normal amounts of current, said drive transistor again allows the input signal to be transmitted as the output current.

10. The current limiting circuit as defined in claim 8 wherein said current mirror means comprises:

a first transistor connected in parallel with said drive transistor and having a source terminal connected to the input means and a drain terminal coupled to the output means and further having a gate coupled to the drain terminal;

a second transistor having a source terminal coupled to said input means and a gate terminal coupled to said gate of said first transistor; and a third transistor having a source terminal coupled to a drain terminal of the second transistor and a drain terminal connected to the gate terminal of the drive transistor.

11. The current limiting circuit as defined in claim 8 wherein said current limiting circuit is fabricated on said chip.

12. The current limiting circuit as defined in claim 8 wherein said bias control voltage is provided from a chip's internal logic supply current signal being applied to said bias resistor to create a reference voltage potential thereacross.

13. The current limiting circuit as defined in claim 12 further comprising:

a second current mirror means for receiving the chip's internal logic supply current signal and providing said logic supply current signal to the bias control resistor.

14. The current limiting circuit as defined in claim 13 wherein said second current mirror means includes at least one transistor that is formed on a substrate common to said drive transistor so as to achieve temperature compensation.

15. A method for limiting the current supplied to the active circuitry of a chip, said method comprising:

receiving a supply signal;

monitoring current drawn by active circuitry of a chip with a current limiting circuit having a drive transistor with a gate for receiving a bias control signal;

providing said supply signal as output current through said drive transistor to the chip's active circuitry when the current drawn by the chip is below a preset amount of current;

generating an overflow current in response to an output current overflow condition;

creating an increased bias control signal supplied to the gate of the drive transistor in response to the overflow current;

triggering the drive transistor to shut off the current supply to the output in response to an increased bias control signal;

generating a reset signal to reset logic circuitry associated with the chip so as to correct the current demand; and allowing said supply signal to be provided as an output to the chip's active circuitry when the current drawn drops below a preset amount of current.

16. The method as defined in claim 15 wherein said current limiting circuit is fabricated on the chip along with said active circuitry.

* * * * *